United States Patent
Bailey, III et al.

(10) Patent No.: US 9,864,361 B2
(45) Date of Patent: Jan. 9, 2018

(54) FLEXIBLE TEMPERATURE COMPENSATION SYSTEMS AND METHODS FOR SUBSTRATE PROCESSING SYSTEMS

(71) Applicant: Lam Research Corporation, Fremont, CA (US)

(72) Inventors: Andrew D. Bailey, III, Pleasanton, CA (US); Marcus Carbery, Clontarf (IE)

(73) Assignee: LAM RESEARCH CORPORATION, Fremont, CA (US)

( * ) Notice: Subject to any disclaimer, the term of this patent is extended or adjusted under 35 U.S.C. 154(b) by 239 days.

(21) Appl. No.: 14/862,789

(22) Filed: Sep. 23, 2015

(65) Prior Publication Data

US 2016/0370788 A1 Dec. 22, 2016

Related U.S. Application Data

(60) Provisional application No. 62/182,877, filed on Jun. 22, 2015, provisional application No. 62/182,884, filed on Jun. 22, 2015, provisional application No. 62/182,896, filed on Jun. 22, 2015, provisional application No. 62/182,905, filed on Jun. 22, 2015.

(51) Int. Cl.
*G05B 19/404* (2006.01)
*G05B 15/02* (2006.01)

(52) U.S. Cl.
CPC .......... *G05B 19/404* (2013.01); *G05B 15/02* (2013.01); *G05B 2219/49206* (2013.01); *G05B 2219/49219* (2013.01)

(58) Field of Classification Search
CPC ........ G05B 19/404; G05B 2219/49206; G05B 2219/49219
See application file for complete search history.

(56) References Cited

U.S. PATENT DOCUMENTS

| | | |
|---|---|---|
| 8,461,674 B2 | 6/2013 | Gaff et al. |
| 8,546,732 B2 | 10/2013 | Singh |
| 8,587,113 B2 | 11/2013 | Gaff et al. |
| 8,624,168 B2 | 1/2014 | Gaff et al. |
| 8,637,794 B2 | 1/2014 | Singh et al. |
| 8,642,480 B2 | 2/2014 | Gaff et al. |
| 8,680,441 B2 | 3/2014 | Singh |
| 8,755,204 B2 | 6/2014 | Benjamin |
| 8,791,392 B2 | 7/2014 | Singh |
| 8,809,747 B2 | 8/2014 | Pease et al. |
| 8,809,774 B2 | 8/2014 | Vertes et al. |
| 8,852,964 B2 | 10/2014 | Kimura et al. |
| 8,884,194 B2 | 11/2014 | Singh et al. |
| 2001/0019741 A1 | 9/2001 | Inaba et al. |
| 2014/0073066 A1 | 3/2014 | Tabuchi |
| 2015/0176928 A1 | 6/2015 | Tabuchi |

*Primary Examiner* — Yuhui R Pan

(57) ABSTRACT

A system includes memory that stores compensation information that associates process setpoint temperatures with respective adjustment values. The respective adjustment values include a first adjustment value corresponding to a first temperature compensation scheme and at least one second adjustment value corresponding to a second compensation scheme. A temperature compensation module receives a first process setpoint temperature, retrieves the compensation information from the memory based on the received first process setpoint temperature, calculates a first compensated temperature based on the received first process setpoint temperature, the first adjustment value, and the second adjustment value, and controls a temperature of a component of a substrate processing system according to the first compensated temperature.

20 Claims, 4 Drawing Sheets

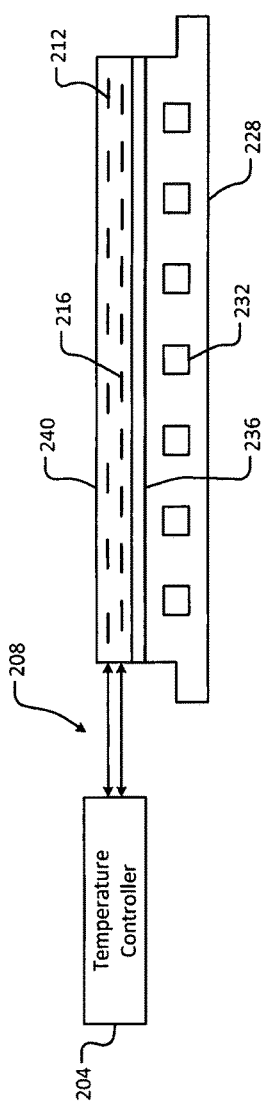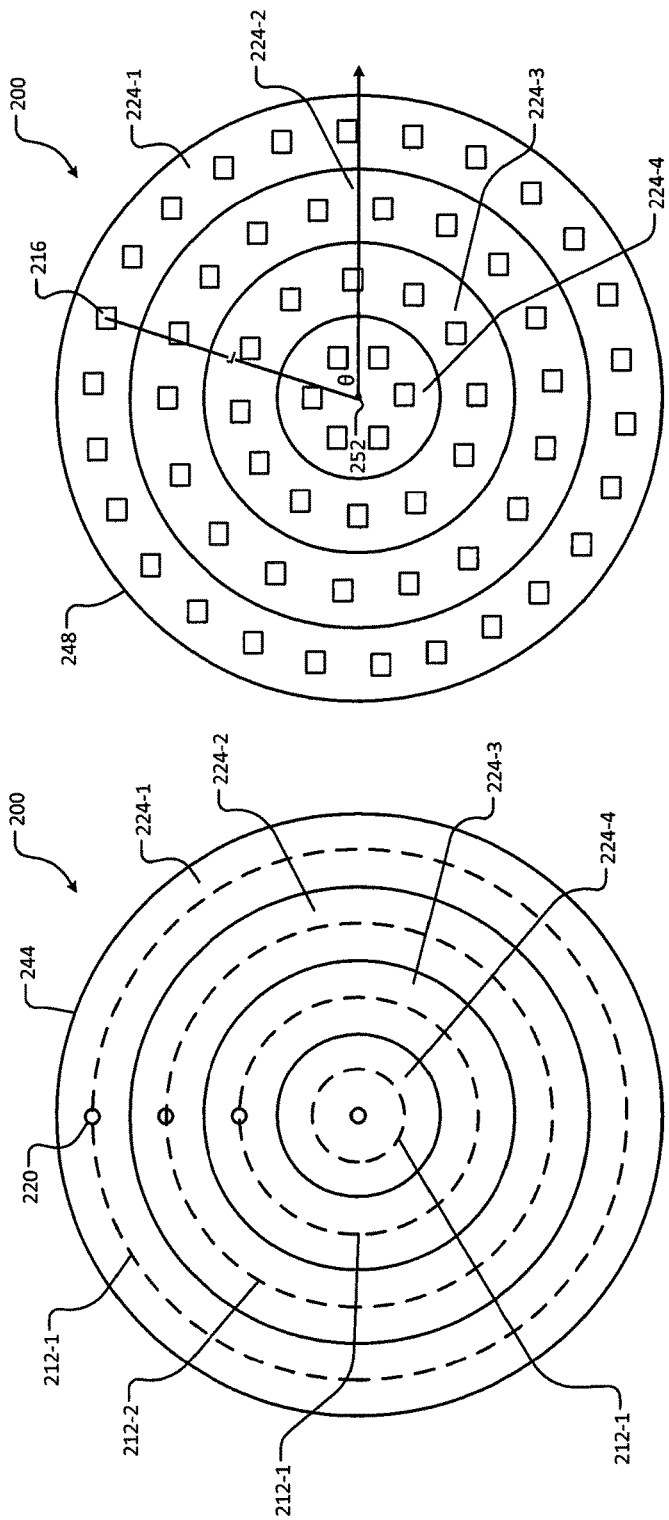

FLEXIBLE TEMPERATURE COMPENSATION SYSTEMS AND METHODS FOR SUBSTRATE PROCESSING SYSTEMS

CROSS-REFERENCE TO RELATED APPLICATIONS

This application claims the benefit of U.S. Provisional Application No. 62/182,877, filed on Jun. 22, 2015, U.S. Provisional Application No. 62/182,884, filed on Jun. 22, 2015, U.S. Provisional Application No. 62/182,896, filed on Jun. 22, 2015, and U.S. Provisional Application No. 62/182,905, filed on Jun. 22, 2015. The entire disclosures of the applications referenced above are incorporated herein by reference.

FIELD

The present disclosure relates to substrate processing systems, and more particularly to systems and methods for controlling the temperature of components in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a chemically enhanced plasma vapor deposition (CEPVD) process, a sputtering physical vapor deposition (PVD) process, an ion implantation process, and/or other etch (e.g., chemical etch, plasma etch, reactive ion etch, etc.), deposition, and cleaning processes. A substrate may be arranged on a substrate support, such as a pedestal, an electrostatic chuck (ESC), etc. in a processing chamber of the substrate processing system. For example, during etching, a gas mixture including one or more precursors is introduced into the processing chamber and plasma is struck to etch the substrate.

During process steps, temperatures of various components of the system, and the substrate itself, may vary. These temperature variations may have undesirable effects on the resulting substrates (e.g., non-uniform critical dimensions). In some implementations, temperature variations may result in desirable effects on the substrates. For example, if substrate non-uniformity is present prior to etching, spatial control of temperature and the etching process may be used to correct for non-uniformities. Accordingly, substrate processing systems may implement various systems and methods for controlling temperatures of various components and the substrates during processing.

SUMMARY

A system includes memory that stores compensation information that associates process setpoint temperatures with respective adjustment values. The respective adjustment values include a first adjustment value corresponding to a first temperature compensation scheme and at least one second adjustment value corresponding to a second compensation scheme. A temperature compensation module receives a first process setpoint temperature, retrieves the compensation information from the memory based on the received first process setpoint temperature, calculates a first compensated temperature based on the received first process setpoint temperature, the first adjustment value, and the second adjustment value, and controls a temperature of a component of a substrate processing system according to the first compensated temperature.

A method includes storing compensation information that associates process setpoint temperatures with respective adjustment values. The respective adjustment values include a first adjustment value corresponding to a first temperature compensation scheme and at least one second adjustment value corresponding to a second compensation scheme. The method further includes receiving a first process setpoint temperature, retrieving the compensation information from the memory based on the received first process setpoint temperature, calculating a first compensated temperature based on the received first process setpoint temperature, the first adjustment value, and the second adjustment value, and controlling a temperature of a component of a substrate processing system according to the first compensated temperature.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A is an example electrostatic chuck according to the principles of the present disclosure;

FIG. 2B illustrates zones and macro thermal control elements of an example electrostatic chuck according to the principles of the present disclosure;

FIG. 2C illustrates zones and micro thermal control elements of an example electrostatic chuck according to the principles of the present disclosure;

In the drawings, reference numbers may be reused to identify similar and/or identical elements.

DETAILED DESCRIPTION

Figure 1:
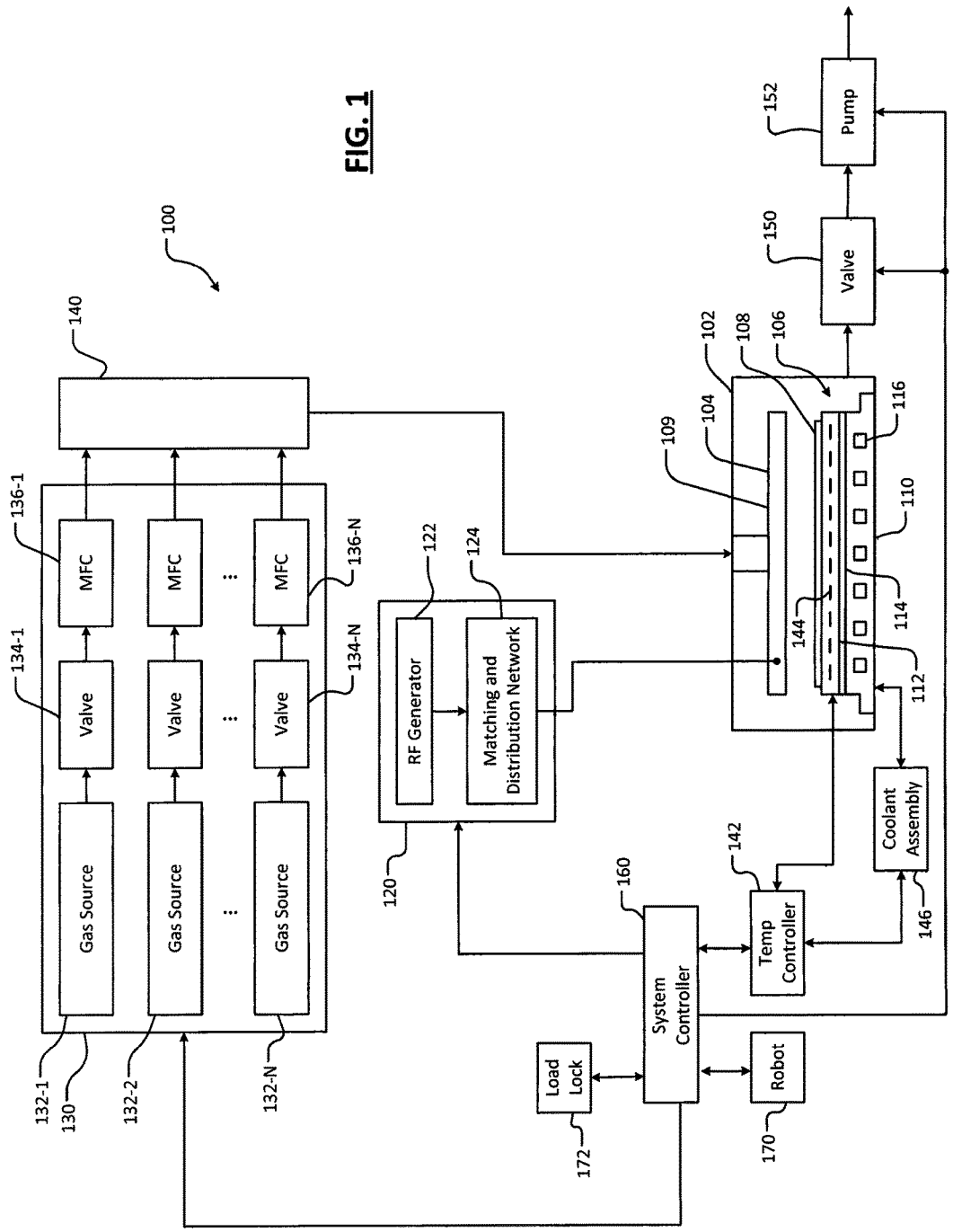
FIG. 1 is a functional block diagram of an example substrate processing system including an electrostatic chuck according to the principles of the present disclosure.

In a substrate processing system, temperatures of a substrate support, such as an electrostatic chuck (ESC), may be controlled during process steps. For example, different processes and respective steps may require that a substrate is maintained at different temperatures. A contact surface temperature of the ESC may be controlled to maintain the substrate at desired temperatures. For example only, the ESC may include a heating plate (e.g., a ceramic heating plate). The substrate may be arranged on the heating plate. Accordingly, the temperature of the heating plate is controlled to achieve the desired temperatures of the substrate.

Variations in the manufacturing process may cause corresponding variations in the characteristics of the heating plate and the performance of the temperature control of the heating plate. For example, variations (i.e., non-uniformities) may include, but are not limited to, local variations in thicknesses and/or thermal conductivity of layers in the construction of the heating plate, variations in the flatness of machined surfaces, and/or variations in characteristics of respective thermal control elements (TCEs) within the heating plate. These non-uniformities may result in local differences in heat transfer (i.e., local temperature non-uniformity), and therefore non-uniformities in substrate temperatures.

Other system variations may further affect the temperature non-uniformities. The other system variations may include, but are not limited to, variations between different substrate processing chambers, variations between process steps (e.g., the presence, type, amount, duration, etc. of a plasma step), differences between a temperature within the chamber and the temperature of the ESC, variations in process parameters (e.g., power, frequency, etc.), variations between individual wafers, and/or variations in user inputs/constraints.

Systems and methods may be implemented to compensate for the temperature non-uniformities, including both temperature non-uniformities caused by variations in the manufacturing process of the ESC and temperature non-uniformities affected by variations between chambers, process steps, process parameters, etc. In one example implementation, an ESC including one or multiple zones (e.g., a multi-zone ESC) may include respective macro TCEs for each zone of a heating plate and a plurality of micro TCEs distributed throughout the heating plate. The plurality of micro TCEs may be individually controlled to compensate for the temperature non-uniformities in each zone of the ESC.

In another example, a temperature of the ESC may be controlled according to a current temperature of the ESC and a setpoint temperature for an upcoming process step. For example, the temperature of the ESC may be increased (i.e., the ESC may be preheated) and/or decreased (i.e., the ESC may be pre-cooled) prior to the beginning of the next process step while compensating for temperature non-uniformities. In another example, the temperature of the ESC may be controlled according to the setpoint temperature while compensating for temperature non-uniformities related to a specific process step (e.g., whether plasma is present). In another example, the temperature of the ESC may be controlled according to the setpoint temperature while compensating for characteristics of the specific chamber being used to perform the process step.

Flexible temperature compensation systems and methods according to the principles of the present disclosure combine two or more compensation schemes for temperature non-uniformities and other system variations. For example, the temperature (or other parameter) of the ESC or another component of a substrate processing system is controlled according to temperature non-uniformities as well as other known system variations on a step-by-step basis. Accordingly, temperature adjustments as determined by multiple different compensation schemes may be combined, aggregated, averaged, etc. to compensate for multiple types of system variations. In implementations, the systems and methods may perform compensation further based on user inputs. For example, a user input may define one or more desired values for respective parameters of a substrate processing system (e.g., using input knobs, dials, etc.). Accordingly, the compensation may be performed to accommodate the desired value for the single parameter as requested by the user. Further, the compensation may be performed to accommodate the desired value as defined by the user for multiple parameters of the substrate processing system. In one example, a single compensation value may be calculated based on a combination of the multiple parameters. The single compensation value may then be applied to one compensation scheme and/or in combination with two or more compensation schemes. In another example, multiple control components of the substrate processing system may be used to control the multiple parameters independently, and/or in conjunction with temperature compensation components.

Referring now to FIG. 1, an example substrate processing system 100 for performing etching using RF plasma is shown. The substrate processing system 100 includes a processing chamber 102 that encloses other components of the substrate processing chamber 100 and contains the RF plasma. The substrate processing chamber 100 includes an upper electrode 104 and a substrate support, such as an electrostatic chuck (ESC) 106. During operation, a substrate 108 is arranged on the ESC 106.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The ESC 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the ESC 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate as described in more detail in FIGS. 2A and 2B. The temperature controller 142 may be used to control the plurality of TCEs 144 to control a temperature of the ESC 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the ESC 106.

A valve 150 and pump 152 may be used to evacuate reactants from the processing chamber 102. A system controller 160 may be used to control components of the substrate processing system 100. A robot 170 may be used to deliver substrates onto, and remove substrates from, the ESC 106. For example, the robot 170 may transfer substrates between the ESC 106 and a load lock 172. Although shown as separate controllers, the temperature controller 142 may be implemented within the system controller 160.

Referring now to FIGS. 2A, 2B, and 2C, an example ESC 200 is shown. A temperature controller 204 communicates with the ESC 200 via one or more electrical connections 208. For example, the electrical connections 208 may include, but are not limited to, connections for selectively controlling macro TCEs 212-1, 212-2, 212-3, and 212-4, referred to collectively as macro TCEs 212, and/or micro TCEs 216 and connections for receiving temperature feedback from one or more zone temperature sensors 220. Although the micro TCEs 216 as shown in FIGS. 2B and 2C are aligned with the macro TCEs 212 in a circular, concentric arrangement, other arrangements of the micro TCEs 216 with respect to the macro TCEs 212 may be used.

As shown, the ESC 200 is a multi-zone ESC including zones 224-1, 224-2, 224-3, and 224-4, referred to collectively as zones 224. Although shown with the four concentric zones 224, in embodiments the ESC 200 may include one, two, three, or more than four of the zones 224. The shapes of the zones 224 may vary. For example, the zones 224 may be provides as quadrants or another grid-like arrangement. Each of the zones 224 includes, for example only, a respective one of the zone temperature sensors 220 and a respective one of the macro TCEs 212. In embodiments, each of the zones 224 may include more than one of the temperature sensors 220. For example, the ESC 200 includes a baseplate 228 including coolant channels 232, a thermal resistance layer 236 formed on the baseplate 228, and a multi-zone ceramic heating plate 240 formed on the thermal resistance layer 236. The heating plate 240 may include multiple bonded layers, including a first layer 244 as shown in FIG. 2B and a second layer 248 as shown in FIG. 2C. The first layer 244 includes the macro TCEs 212 and the second layer 248 includes the plurality of micro TCEs 216.

The temperature controller 204 controls the macro TCEs 212 and the micro TCEs 216 according to a desired setpoint temperature. For example, the temperature controller 204 may receive (e.g., from the system controller 160 as shown in FIG. 1) a setpoint temperature for one or more of the zones 224. For example only, the temperature controller 204 may receive a same setpoint temperature for all or some of the zones 224 and/or different respective setpoint temperatures for each of the zones 224. The setpoint temperatures for each of the zones 224 may vary across different processes and different steps of each process.

The temperature controller 204 controls the macro TCEs 212 for each of the zones 224 based on the respective setpoint temperatures and temperature feedback provided by the sensors 220. For example, the temperature controller 204 individually adjusts power (e.g., current) provided to each of the macro TCEs 212 to achieve the setpoint temperatures at each of the sensors 220. The macro TCEs 212 may each include a single resistive coil or other structure schematically represented by the dashed lines of FIG. 2B. Accordingly, adjusting one of the macro TCEs 212 affects the temperature of the entire respective zone 224, and may also affect other ones of the zones 224. The sensors 220 may provide temperature feedback for only a local portion of each of the zones 224. For example only, the sensors 220 may be positioned in a portion of each zone 224 previously determined to have the closest correlation to the average temperature of the zone 224.

Conversely, the temperature controller 204 may individually control each of the micro TCEs 216 to locally adjust temperatures of the zones 224. For example, although each micro TCE 216 may be located entirely within one of the zones 224, adjusting a thermal output of any one of the micro TCEs 216 may have a thermal impact across multiple zones 224 and localities of the heating plate 240. Accordingly, one or more of the micro TCEs 216 may be selectively activated and/or deactivated to further adjust temperatures of the zones 224.

In example implementations, one or more of the micro TCEs 216 may be selectively activated during process steps to compensate for non-uniformities in the zones 224 of the heating plate 240. For example, the non-uniformities may cause, for a given temperature setpoint, non-uniform temperatures across a respective zone 224. For example, if a setpoint for the zone 224-1 is set to 50° C., actual temperatures in the zone 224-1 may vary (e.g., from 47° C. to 53° C., including local temperatures of 47° C., 48° C., 49° C., etc.), and the temperature feedback provided by the sensor 220 may only indicate the temperature for the zone 224-1 at the location of the sensor 220. Accordingly, adjusting a power percentage of the macro TCE 212-1 to a level corresponding to 50° C. may not result in the entirety of the zone 224-1 being maintained at the desired 50° C.

One or more of the micro TCEs 216 may be activated to achieve any desired setpoint temperature for the entire zone 224. Non-uniformities along an annular path defined by each of the zones 224 may be referred to as azimuthal non-uniformities (i.e., non-uniformity from one point along the annular path to another point along the annular path). For example only, each of the micro TCEs 216 may be identified by a radius r (i.e., a distance from a centerpoint 252) and an angle θ, which corresponds to an azimuthal position within the zone 224.

The temperature controller 204 implements the flexible temperature compensation systems and methods according to the principles of the present disclosure. The temperature controller 204 combines two or more compensation schemes for temperature non-uniformities and other system variations as described below in more detail.

Figure 3:
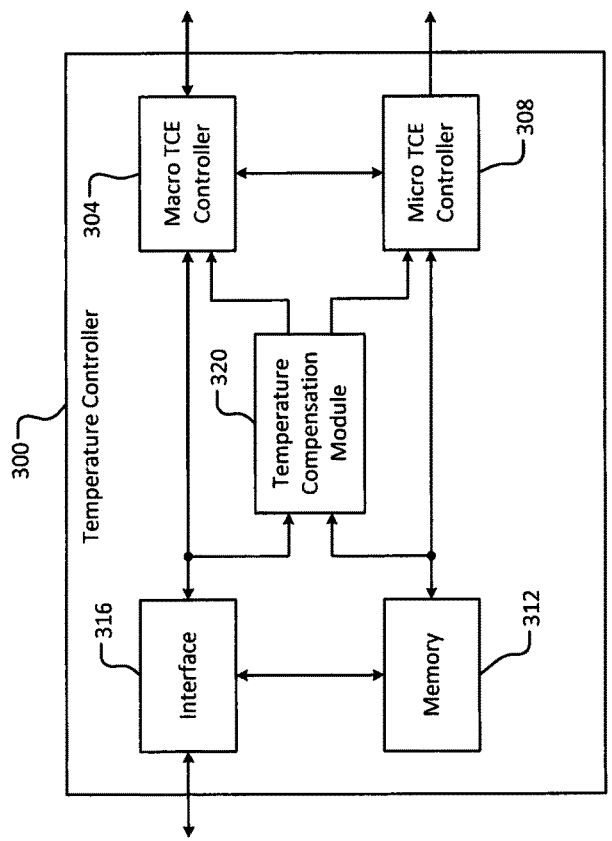
FIG. 3 is an example temperature controller according to the principles of the present disclosure.

Referring now to FIG. 3, a temperature controller 300 according to the principles of the present disclosure includes a macro TCE controller 304 and a micro TCE controller 308

(which, in embodiments, may be implemented as a single controller), memory 312, an interface 316 (for communicating with, for example, the system controller 160 as shown in FIG. 1, for receiving user inputs, etc.), and a temperature compensation module 320). For example, the temperature controller 300 receives process setpoint temperatures (e.g., desired setpoint temperatures for respective process steps) and/or other parameters from the system controller 160 via the interface 316. The interface 316 provides the process setpoint temperatures to the temperature compensation module 320. In some embodiments, the interface 316 may provide the process setpoint temperatures directly to the macro TCE controller 304. The process setpoint temperatures may include a single setpoint temperature for every zone 224 and/or different process setpoint temperatures for each of the respective zones 224.

The macro TCE controller 304 controls the macro TCEs 212 according to the received process setpoint or setpoints. The micro TCEs 216 can then be controlled to achieve the process setpoint throughout each of the zones 224, thereby compensating for temperature non-uniformities in the zones 224.

In one example implementation, control of each micro TCE 216 may be based on (i) a relationship between a calibration setpoint for the macro TCEs 212 and corresponding temperature responses in each of the zones 224, and (ii) a relationship between a power percentage provided to each of the micro TCEs 216 and corresponding temperature responses (e.g., local changes in temperature) in each of the zones 224. Data indicative of the relationships (i) and (ii) may be stored in the memory 312. For example, the data may include the temperature responses of each of the macro TCEs 212 at a calibration setpoint and the temperature responses of each of the micro TCEs 216 at other respective calibration setpoints (which may be equal to or different from the calibration setpoint for the macro TCEs 212). In other words, for (i), temperature responses (which are indicative of temperature non-uniformities) of the macro TCEs 212 in each of the zones 224 for the calibration setpoint (e.g., a first predetermined value of a control parameter, such as a power percentage provided to the macro TCEs 212) may be known/predetermined. Conversely, for (ii), the temperature response of every one of the micro TCEs 216, at respective calibration setpoints (i.e., power percentages), on surrounding portions of each of the zones 224 may be known/predetermined.

Accordingly, for the macro TCE calibration setpoint, the temperature responses in each of the zones 224 when the macro TCEs 212 are controlled to the calibration setpoint are stored in memory 312. Further, the temperature responses of each micro TCE 216 when the micro TCEs 216 are controlled to respective calibration setpoints are also stored in memory 312. For example only, the temperature responses of the macro TCEs 212 and the micro TCEs 216 may be measured using thermocouples or other suitable mechanisms. For example only, the memory 312 may include non-volatile memory such as flash memory.

In an example implementation, the temperature compensation module 320 provides compensated setpoint temperature values to the macro TCE controller 304 and/or the micro TCE controller 308 based on the process setpoint temperatures, user inputs, various other parameters of the substrate processing system, and compensation information stored in the memory 312. In other examples, the temperature compensation module 320 may provide, instead of the compensated setpoint temperature values, temperature adjustment values to be used by the macro TCE controller 304 and/or the micro TCE controller 308. Accordingly, in embodiments, the macro TCE controller 304 and the micro TCE controller 308 may operate according to compensated setpoint temperature values received from the temperature compensation module 302 or the process setpoint temperatures as modified by the temperature adjustment values.

The compensation information stored in the memory 312 includes information associated with two or more compensation schemes for temperature non-uniformities and other system variations. For example, a first compensation scheme may correspond to temperature compensation for manufacturing non-uniformities in the ESC using the micro TCEs 216 as described above. A second compensation scheme may correspond to temperature compensation for another system variation (e.g., variations in temperatures caused by different process steps, chemistry, system parameters, temperatures within the substrate processing chamber, wafer characteristics, etc.). For example only, the variations in wafer characteristics may include, but are not limited to, incoming variations or desired changes in a targeted output metric of the wafer, specific adjustments to correct for differences in chamber to wafer interaction or component wear, etc. Accordingly, for any given process setpoint temperature, the temperature compensation module 320 may retrieve two or more adjustment values (e.g., temperature offsets or deltas, adjusted setpoints, etc.) and provide the compensated setpoint temperature value based on the two or more adjustment values. For example, the adjustment values may correspond to setpoints for each of the micro TCEs 216 for a given setpoint of one or more of the macro TCEs 212. In another example, the adjustment values may correspond directly to setpoints for the macro TCEs 212.

The compensated setpoint temperature value provided by the temperature compensation module 320 may correspond to any function or weighted function of the two or more adjustment values, including, but not limited to, a sum, average, weighted sum, weighted average, weighted arithmetic or geometric mean, etc. of the two or more adjustment values. For example, in some examples, one or more of the compensation schemes can be ignored or assigned weights (e.g., from 0 to 100%) based on user inputs. For example only, the compensated setpoint temperature value $T_C$ may be calculated according to $T_C = T_B + (T_{A1} + T_{A2} + \ldots + T_{An})$, where $T_B$ corresponds to a baseline temperature (e.g., a setpoint for a macro TCE or a micro TCE) and $T_{Ax}$ is an adjustment to the setpoint corresponding to a respective compensation scheme. In another example, $T_C$ may be calculated according to $T_C = (T_1 + T_2 + \ldots + T_n)/n$, where $T_x$ is a setpoint temperature (e.g., for either a macro TCE or a micro TCE for a given process setpoint) corresponding to a respective compensation scheme. In another example, $T_C$ may be calculated according to $T_C = (w_1 T_1 + w_2 T_2 + \ldots + w_n T_n)$, where $w_x$ corresponds to a weight assigned to a respective compensation scheme and $w_1 + w_2 + \ldots + w_n = 1$.

In other examples, the compensation schemes may be combined/adjusted based on rotation of the wafer. For example, Tc may be calculated according to a sum (weighted or unweighted) of compensation schemes separately classified as wafer compensation schemes (e.g., compensation schemes related to variations in wafer characteristics, position, etc.) and chamber compensation schemes (e.g., compensation schemes related to variations in components of the substrate processing system and/or chamber). For example, the wafer compensation schemes may be rotated, shifted, offset, etc. based on wafer position (e.g., orientation and placement) while the chamber compensation schemes remain static regardless of wafer position.

The compensation schemes may include, but are not limited to, compensation schemes for temperature non-uniformities in the ESC, variations between process steps, variations between process chambers, variations between other parameters of the substrate processing system, variations caused by wafer position (e.g., based on a detected wafer position), variations caused by known characteristics of the wafer (e.g., characteristics associated with previous process steps, processing in a previous or later chamber, etc.), variations of temperatures within the processing chamber, user inputs or preferences, etc.

Figure 4:
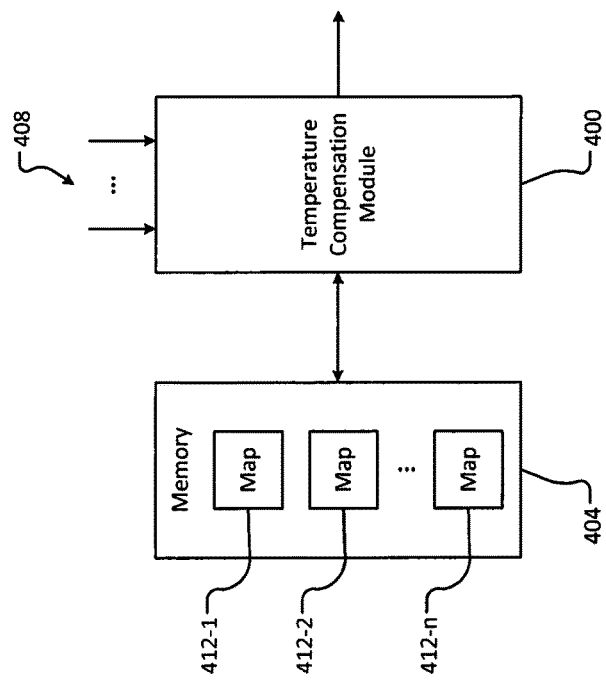
FIG. 4 is an example temperature compensation module and memory according to the principles of the present disclosure.

Referring now to FIG. 4, a temperature compensation module 400 communicates with an example memory 404 shown in more detail according to the present disclosure. The temperature compensation module 400 receives one or more inputs 408. The inputs 408 may correspond to, for example only, process setpoint temperatures and/or other parameters received from the interface 316, other recipe steps, sensor readings, user inputs, etc. The temperature compensation module 400 retrieves compensation information stored in the memory 404 based on the inputs 408.

For example, the compensation information stored in the memory 404 may include two or more compensation maps 412-1, 412-2, ..., and 412-n, referred to collectively as compensation maps 412. Each of the compensation maps 412 stores compensation information associated with a respective compensation scheme as described above. For example only, each of the maps 412 (e.g., using lookup tables) associates a plurality of process setpoint temperatures with respective adjustment values (e.g., for one or more macro TCEs, micro TCEs, etc.) for respective system variations. For example, the map 412-1 may correspond to temperature non-uniformities in the ESC. Conversely, the maps 412-2, ..., 412-n may respectively correspond to different process steps, process chambers, other parameters of the substrate processing system (e.g., power, frequency, etc.), wafer positions, wafer characteristics), user inputs or preferences, etc.

The temperature compensation module 400 may use any combination of the compensation maps 412 to generate a compensated setpoint temperature, including none or all of the compensation maps 412. For example, the compensation maps 412 may be selectively enabled or disabled, weighted, etc. based on user inputs or preferences and various system parameters. For example, a compensation map associated with user inputs may be selectively disabled if disabled by a user. In some examples, the substrate processing system may include a plurality of knobs or other interface devices (e.g., a graphical user interface) to receive user inputs for selectively enabling, disabling, and weighting the compensation maps 412. In embodiments, feedback may be provided to the user via the graphical user interface. The feedback may indicate, for example only, the accuracy of the compensated setpoint temperature with respect to desired process temperatures, user inputs, etc.

Figure 5:
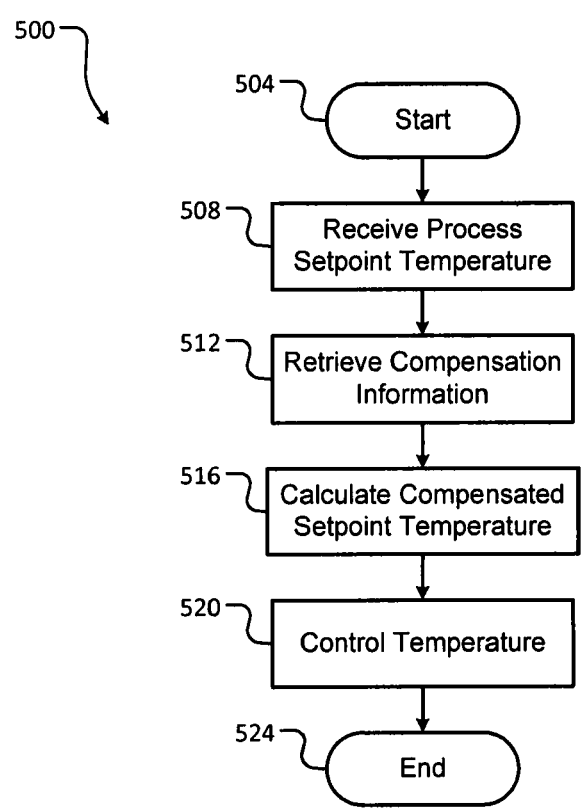
FIG. 5 illustrates steps of an example temperature compensation method according to the principles of the present disclosure.

Referring now to FIG. 5, an example temperature compensation method 500 begins at 504. At 508, a temperature controller (e.g., temperature controller 300 as shown in FIG. 3) receives a process setpoint temperature. For example, the process setpoint temperature corresponds to a desired temperature setpoint for a substrate support (e.g., an ESC) for a current and/or upcoming process step. At 512, the temperature controller retrieves, based on the received process setpoint temperature, compensation information including two or more adjustment values. For example, the adjustment values may be indexed according to a plurality of process setpoint temperatures in respective compensation maps. At 516, the temperature controller calculates a compensated setpoint temperature based on the received process setpoint temperature and the retrieved compensation information. At 520, the temperature controller controls a temperature (e.g., a temperature of an ESC) based on the compensated setpoint temperature. The method 500 ends at 524.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to,"

"on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system, comprising:
    memory that stores compensation information that associates process setpoint temperatures with respective adjustment values, wherein the respective adjustment values include a first adjustment value corresponding to a first temperature compensation scheme and at least one second adjustment value corresponding to a second temperature compensation scheme; and
    a temperature compensation module that receives a first process setpoint temperature, retrieves the compensation information from the memory based on the received first process setpoint temperature, calculates a first compensated temperature based on the received first process setpoint temperature, the first adjustment value, and the second adjustment value, and controls a temperature of a component of a substrate processing system according to the first compensated temperature,
    wherein (i) the first temperature compensation scheme corresponds to a compensation scheme for one of temperature non-uniformities within a substrate, variations between process steps, variations between process chambers, variations between control parameters, variations associated with characteristics of a wafer, and variations of temperature within a process chamber, and (ii) the second temperature compensation scheme corresponds to a compensation scheme for a different one of the temperature non-uniformities within the substrate, the variations between process steps, the variations between process chambers, the variations between control parameters, the variations associated with characteristics of the wafer, and the variations of temperatures within the process chamber.

2. The system of claim 1, wherein the temperature compensation module controls the temperature of the component of the substrate processing system according to the first compensated temperature for a first processing step and controls the temperature of the component of the substrate processing system according to a second compensated temperature for a second processing step subsequent to the first processing step.

3. The system of claim 1, wherein the temperature compensation module assigns respective weights to the first adjustment value and the at least one second adjustment value.

4. The system of claim 3, wherein the temperature compensation module assigns the respective weights based on user inputs.

5. The system of claim 4, further comprising a user interface that receives the user inputs.

6. The system of claim 1, wherein the compensation information includes a first compensation map corresponding to the first temperature compensation scheme and a second compensation map corresponding to the second temperature compensation scheme.

7. The system of claim 1, wherein the respective adjustment values include at least one of temperature offsets and adjusted setpoints.

8. The system of claim 1, wherein the respective adjustment values correspond to adjustment values for at least one of a macro thermal control element and a micro thermal control element.

9. The system of claim 1, wherein, to calculate the first compensated temperature, the temperature compensation module calculates the first compensated temperature based on a weighted function of the first adjustment value and the at least one second adjustment value.

10. The system of claim 1, wherein at least one of the first adjustment value and the second adjustment value corresponds to a position of a wafer.

11. The system of claim 1, wherein the memory stores information associating performance results of the substrate processing system with at least one of (i) the process setpoint temperatures, (ii) the respective adjustment values, (iii) the first compensation scheme and the second compensation scheme.

12. A system, comprising:
memory that stores compensation information that associates process setpoint temperatures with respective adjustment values, wherein the respective adjustment values include a first adjustment value corresponding to a first temperature compensation scheme and at least one second adjustment value corresponding to a second temperature compensation scheme; and
a temperature compensation module that receives a first process setpoint temperature, retrieves the compensation information from the memory based on the received first process setpoint temperature, calculates a first compensated temperature based on the received first process setpoint temperature, the first adjustment value, and the second adjustment value, and controls a temperature of a component of a substrate processing system according to the first compensated temperature, wherein at least one of the first adjustment value and the second adjustment value corresponds to characteristics of the substrate processing system in a previous processing step.

13. The system of claim 12, wherein the characteristics of the substrate processing system include at least one of (i) parameters of a previous processing step, (ii) a setpoint of a thermal control element, (iii) a measured power associated with the substrate processing system, (iv) parameters associated with a wafer, and (v) measured or calculated effects caused by component wear.

14. A method, comprising:
storing, in memory, compensation information that associates process setpoint temperatures with respective adjustment values, wherein the respective adjustment values include a first adjustment value corresponding to a first temperature compensation scheme and at least one second adjustment value corresponding to a second temperature compensation scheme;
receiving a first process setpoint temperature;
retrieving the compensation information from the memory based on the received first process setpoint temperature;
calculating a first compensated temperature based on the received first process setpoint temperature, the first adjustment value, and the second adjustment value; and
controlling a temperature of a component of a substrate processing system according to the first compensated temperature,
wherein (i) the first temperature compensation scheme corresponds a compensation scheme for one of temperature non-uniformities within a substrate, variations between process steps, variations between process chambers, variations between control parameters, variations associated with characteristics of a wafer, and variations of temperatures within a process chamber, and (ii) the second temperature compensation scheme corresponds to a compensation scheme for a different one of the temperature non-uniformities within the substrate, the variations between process steps, the variations between process chambers, the variations between control parameters, the variations associated with characteristics of the wafer, and the variations of temperatures within the process chamber.

15. The method of claim 14, further comprising controlling the temperature of the component of the substrate processing system according to the first compensated temperature for a first processing step and controlling the temperature of the component of the substrate processing system according to a second compensated temperature for a second processing step subsequent to the first processing step.

16. The method of claim 14, further comprising assigning respective weights to the first adjustment value and the at least one second adjustment value.

17. The method of claim 14, wherein the compensation information includes a first compensation map corresponding to the first temperature compensation scheme and a second compensation map corresponding to the second temperature compensation scheme.

18. The method of claim 14, wherein at least one of the first adjustment value and the second adjustment value corresponds to a position of a wafer.

19. The method of claim 14, wherein the memory stores information associating performance results of the substrate processing system with at least one of (i) the process setpoint temperatures, (ii) the respective adjustment values, (iii) the first compensation scheme and the second compensation scheme.

20. A method, comprising:
storing, in memory, compensation information that associates process setpoint temperatures with respective adjustment values, wherein the respective adjustment values include a first adjustment value corresponding to a first temperature compensation scheme and at least one second adjustment value corresponding to a second temperature compensation scheme;
receiving a first process setpoint temperature;
retrieving the compensation information from the memory based on the received first process setpoint temperature;
calculating a first compensated temperature based on the received first process setpoint temperature, the first adjustment value, and the second adjustment value; and
controlling a temperature of a component of a substrate processing system according to the first compensated temperature,
wherein at least one of the first adjustment value and the second adjustment value corresponds to characteristics of the substrate processing system in a previous processing step.

* * * * *